(12) United States Patent
Yu et al.

(10) Patent No.: US 8,149,580 B2
(45) Date of Patent: Apr. 3, 2012

(54) HEAT DISSIPATION DEVICE FOR ELECTRONIC DEVICE ASSEMBLY

(75) Inventors: Jian-Ping Yu, Shenzhen (CN); Jian Zhang, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 176 days.

(21) Appl. No.: 12/755,434

(22) Filed: Apr. 7, 2010

(65) Prior Publication Data

US 2011/0103017 A1    May 5, 2011

(30) Foreign Application Priority Data

Oct. 30, 2009  (CN) .......................... 2009 1 0309059

(51) Int. Cl.
*H05K 7/20* (2006.01)
(52) U.S. Cl. ......... 361/710; 361/695; 361/707; 361/720
(58) Field of Classification Search ............. 361/679.47, 361/679.48, 679.52, 700, 704, 707, 709, 361/710, 715, 717–722
See application file for complete search history.

(56) References Cited

U.S. PATENT DOCUMENTS

| | | | | |
|---|---|---|---|---|
| 6,865,082 B2 * | 3/2005 | Huang et al. | .................. | 361/700 |
| 7,336,496 B1 * | 2/2008 | Hsu | ............................... | 361/719 |
| 7,397,667 B2 * | 7/2008 | Lin et al. | ...................... | 361/719 |
| 7,414,850 B2 * | 8/2008 | Hung | ............................ | 361/719 |
| 2007/0236887 A1 * | 10/2007 | Cheng et al. | .................. | 361/700 |
| 2008/0130240 A1 * | 6/2008 | Wang et al. | ..................... | 361/719 |
| 2010/0258276 A1 * | 10/2010 | Chen et al. | ............... | 165/104.26 |

* cited by examiner

*Primary Examiner* — Courtney Smith
(74) *Attorney, Agent, or Firm* — Altis Law Group, Inc.

(57) ABSTRACT

A heat dissipation device adapted for cooling an electronic device mounted on a printed circuit board comprises a base plate adapted for being thermally attached to the electronic device and a clip attached on a top face of the base plate. The base plate comprises two protruding poles protruding downwardly from a bottom face thereof. The protruding poles are capable of extending through the printed circuit board, thereby establishing a location for the heat dissipation device on the printed circuit board. The clip fastens the heat dissipation device on the printed circuit board after the location for the heat dissipation device on the printed circuit board has been established.

18 Claims, 4 Drawing Sheets

HEAT DISSIPATION DEVICE FOR ELECTRONIC DEVICE ASSEMBLY

BACKGROUND

1. Technical Field

The disclosure relates to heat dissipation devices, and particularly to a heat dissipation device for cooling an electronic device.

2. Description of Related Art

With the continuing improvements in the power of electronic components such as central processing units (CPUs), the heat dissipation requirements of such components are attracting increasing attention. Usually a heat sink is installed on a printed circuit board for cooling an electronic device mounted on the printed circuit board. The heat sink typically includes a base thermally contacting the electronic device, and a plurality of fins set on the base. The printed circuit board may be located inside a computer chassis, and the interior space of the computer chassis where the heat sink and the printed circuit board are received is often very limited.

In order to meet the requirements of the layout of a particular computer chassis, the base of the heat sink is typically designed to have a suitable asymmetric shape, and the base is installed on the printed circuit board using screws. However, due to the asymmetric structure of the base, the screws are liable to tightened onto the printed circuit board to different degrees of torque. When this happens, one end of the base is prone to tilt with respect to the electronic device, such that the base is skewed relative to the electronic device. That is, the base does not maintain uniform intimate thermal contact with the electronic device.

What is needed, therefore, is a heat dissipation device for cooling an electronic device which can overcome the limitations described.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
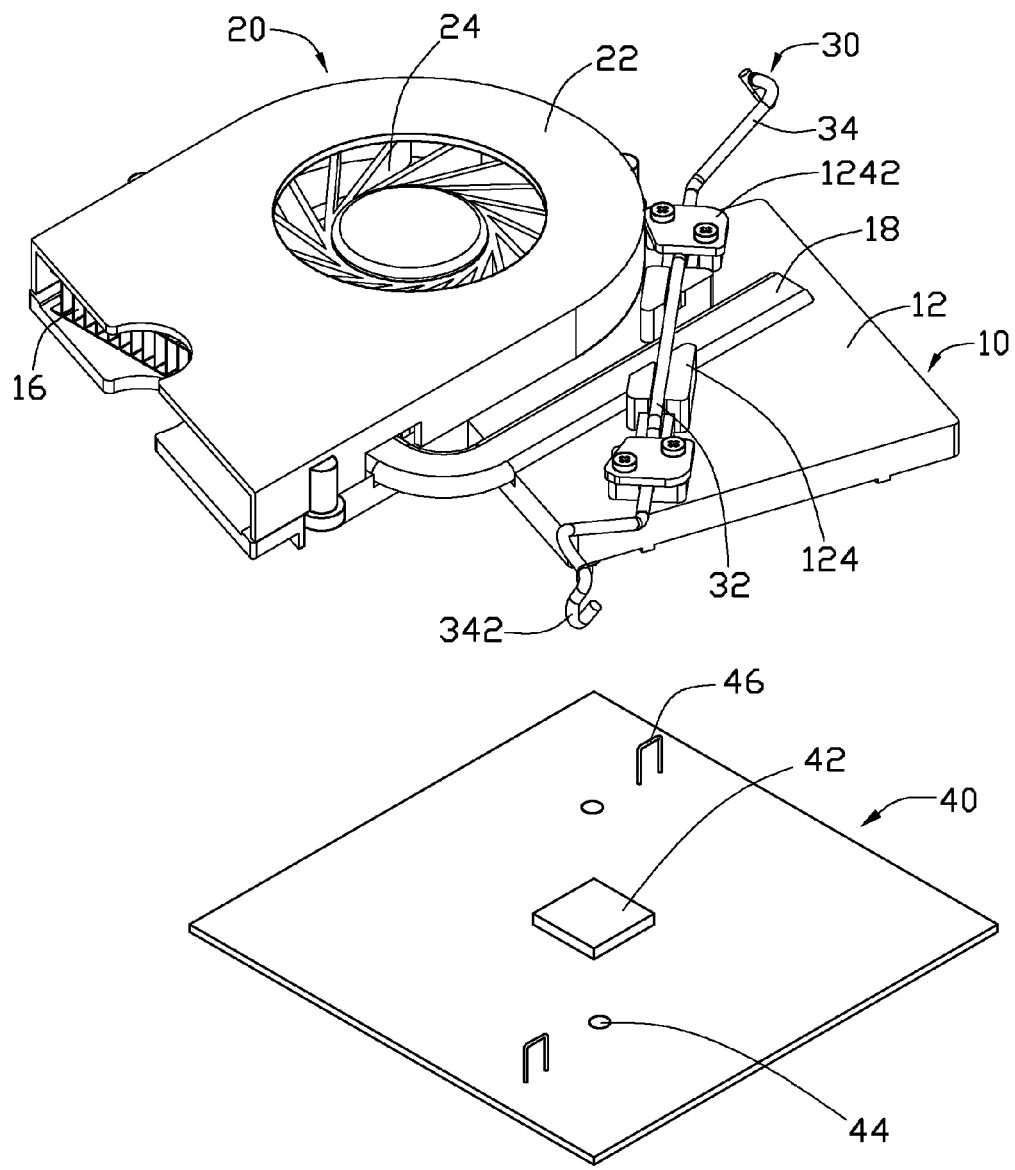
FIG. 1 is an isometric, assembled view of a heat dissipation device in accordance with one embodiment of the disclosure, showing the heat dissipation device ready to be mounted on a printed circuit board.
Figure 2:
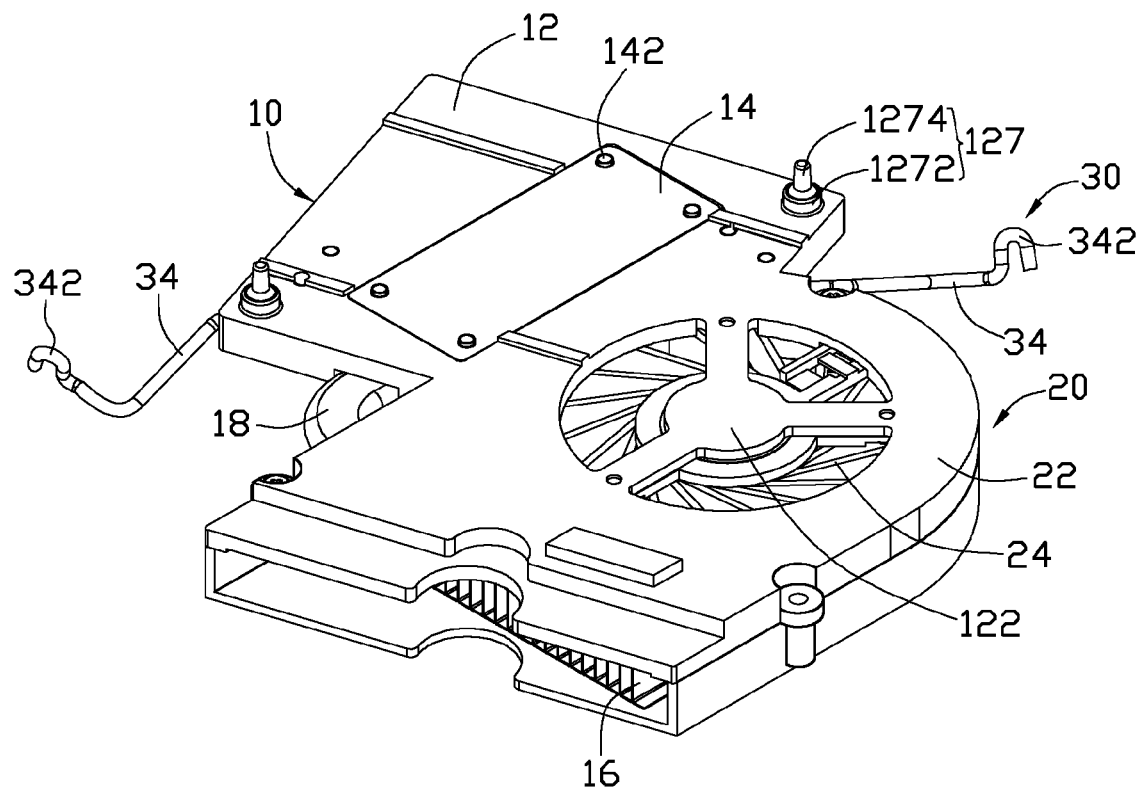
FIG. 2 is an inverted view of the heat dissipation device of FIG. 1.

Referring to FIGS. 1 and 2, a heat dissipation device in accordance with an embodiment of the disclosure is provided for cooling an electronic device 42 mounted on a printed circuit board 40. The heat dissipation device includes a heat sink 10, a fan 20 mounted on the heat sink 10, and a clip 30 clamping the heat sink 10 on the printed circuit board 40.

Figure 3:
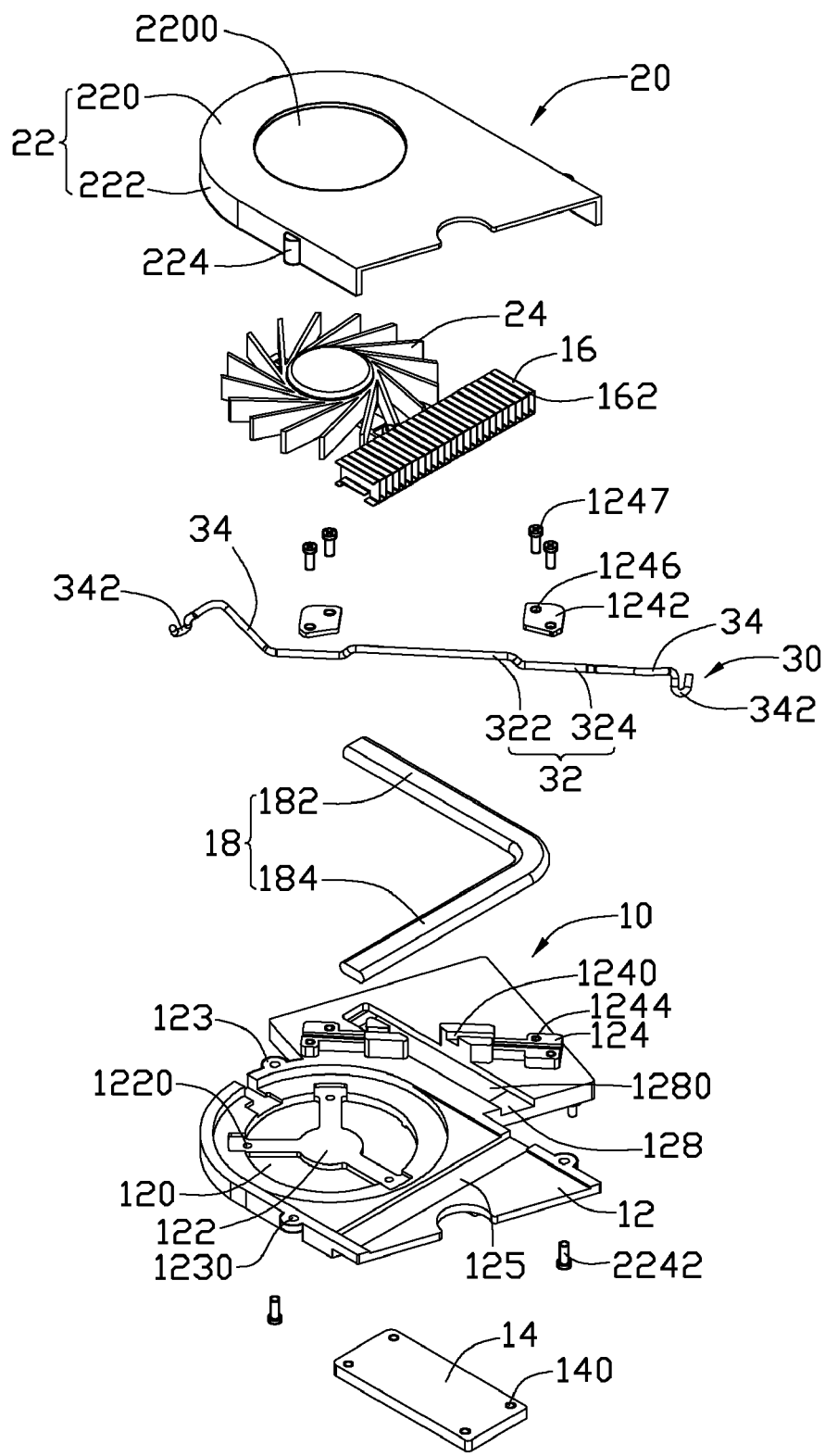
FIG. 3 is an isometric, exploded view of the heat dissipation device of FIG. 1.
Figure 4:
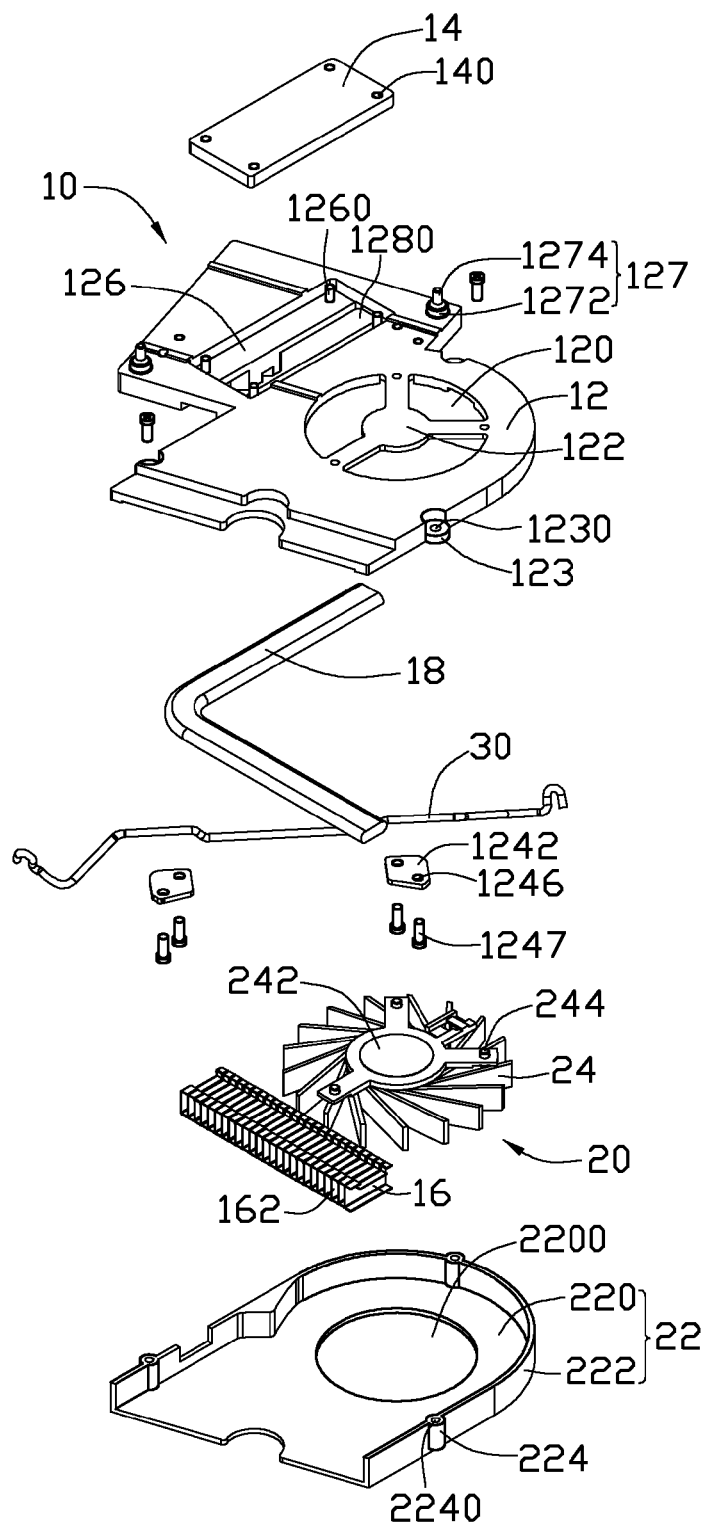
FIG. 4 is an inverted view of the heat dissipation device shown in FIG. 3.

Also referring to FIGS. 3 and 4, the heat sink 10 includes a base plate 12, a heat conducting plate 14 mounted at a bottom of the base plate 12, a fin assembly 16 mounted at a top of the base plate 12, and a heat pipe 18 thermally contacting the base plate 12, the heat conducting plate 14 and the fin assembly 16. The heat conducting plate 14 thermally contacts the electronic device 42 on the printed circuit board 40. The printed circuit board 40 defines two through holes 44, and forms two locking loops 46 around the electronic device 42. The heat pipe 18 is flat and bent into a V-shape, and includes an evaporating section 182 and a condensing section 184.

The base plate 12 is made of metal such as aluminum, and the heat conducting plate 14 is made of metal such as copper. Thus the heat conducting plate 14 has a thermal conductivity larger than that of the base plate 12. The base plate 12 is substantially flat, and can be divided into a generally arch-shaped first part and a generally rectangular second part. An arc-shaped edge of the first part can be considered to integrally and overlappingly adjoin a corner of the second part of the base plate 12, giving the base plate 12 as a whole an asymmetric, irregular shape. The first part of the base plate 12 forms a Y-shaped fixing seat 122 at a center thereof. Three first air inlets 120 are defined in the first part of the base plate 12 around the fixing seat 122, the first air inlets 120 being spaced from each other. The fixing seat 122 defines three fixing holes 1220 in its three branches, for fixing of the fan 20 thereon. Three fixing portions 123 are formed at intervals along an outer edge of a top face of the first part of the base plate 12. Each fixing portion 123 defines a through hole 1230 therein.

The second part of the base plate 12 has a protrusion 124 extending from a top face thereof, corresponding to the electronic device 42 located below the base plate 12. The protrusion 124 is generally elongated and extends along a diagonal direction of the second part of the base plate 12. The protrusion 124 along its extension direction defines a narrow slot 1240, and the clip 30 is placed in the narrow slot 1240. Two fixing plates 1242 are fixed to two ends of the protrusion 124 for fixing the clip 30 in the narrow slot 1240. Each of two ends of the protrusion 124 defines two locking holes 1244, which are located at two sides of the narrow slot 1240, respectively. Each fixing plate 1242 defines two through holes 1246 corresponding to the locking holes 1244. Four screws 1247 extend through the through holes 1246 of the fixing plates 1242 and engage in the locking holes 1244 of the protrusion 124, to fasten the fixing plates 1242 on the protrusion 124. The middle of the protrusion 124 is higher than the two opposite ends thereof, and the middle of the narrow slot 1240 is shallower than the two opposite ends thereof.

The first part and the second part of the base plate 12 respectively define a first groove 125 and a second groove 128 in top faces thereof, for receiving the evaporating section 182 and the condensing section 184 of the heat pipe 18, respectively. The first groove 125 is located adjacent to the fixing seat 122, and the second groove 128 intersects the protrusion 124 at a position corresponding to the electronic device 42. The second groove 128 defines a rectangular through hole 1280 in a bottom thereof. The second part of the base plate 12 defines a rectangular groove 126 in a bottom face thereof, in communication with the second groove 128. The heat conducting plate 14 is received in the rectangular groove 126, and a bottom face of the evaporating section 182 of the heat pipe 18 thermally contacts a top face of the heat conducting plate 14. Four fixing posts 1260 extend downwardly from an inner face of the rectangular groove 126 near four corners of the rectangular groove 126. The heat conducting plate 14 defines four through holes 140 in four corners thereof, corresponding to the four fixing posts 1260. Four screws 142 extend through the through holes 140 of the heat conducting plate 14 and engage in the fixing posts 1260, to fasten the heat conducting plate 14 in the rectangular groove 126 of the base plate 12.

The second part of the base plate 12 has two protruding poles 127 extending downwardly from two diagonal corners of the bottom face thereof. A connection line between the two protruding poles 127 goes across and is symmetrical about the center of the electronic device 42. The projection of the protrusion 124 of the base plate 12 on the printed circuit board 40 intersects the connection line between the two protruding poles 127. Each protruding pole 127 includes a larger, upper pole section 1272 extending downwardly from the bottom face of the base plate 12, and a smaller, lower pole section 1274 extending downwardly from the upper pole section 1272. The upper pole section 1272 has a diameter larger than that of the lower pole section 1274, such that an annular step (not labeled) is formed between the upper pole section 1272 and the lower pole section 1274. A bottom of the upper pole section 1272 is configured to abut the top face of the printed circuit board 40. The lower pole section 1274 has a diameter approximately equal to that of the through hole 44 of the printed circuit board 40.

Before the clip 30 is used to mount the heat dissipation device on the printed circuit board 40, the lower pole sections 1274 of the protruding poles 127 can extend through the through holes 44 of the printed circuit board 40 to position the heat dissipation device on the printed circuit board 40 in advance. The upper pole section 1272 of each protruding pole 127 has a height equal to a height of the electronic device 42, so that the heat conducting plate 14 can thermally and intimately contact the electronic device 42 and is prevented from excessively pressing the electronic device 42.

The fin assembly 16 includes a plurality of fins 162 stacked together. The fins 162 are made of metal such as aluminum, copper or an alloy thereof, and are spaced from each other. A groove (not labeled) is defined in a bottom of the fin assembly 16, and the condensing section 184 of the heat pipe 18 is received in the groove and thermally contacts the fin assembly 16.

The fan 20 is a centrifugal fan, and includes a fan frame 22 and an impeller 24 located inside the fan frame 22. The impeller 24 is rotatably mounted to a Y-shaped supporting seat 242 provided at a bottom of the impeller 24, corresponding to the fixing seat 122 of the base plate 12. The impeller 24 is mounted on the fixing seat 122 of the base plate 12 via screws 244. In particular, the screws 244 extend through the supporting seat 242 and engage in the fixing holes 1220 of the fixing seat 122. The fan frame 22 includes a panel 220, and a side wall 222 extending downwardly and vertically from an outer edge of the panel 220. The shape of the panel 220 corresponds with the first part of the base plate 12, and the panel 220 defines a circular second air inlet 2200 corresponding to the first air inlets 120 of the base plate 12. The side wall 222 of the fan frame 22 forms three mounting ears 224, corresponding to the three fixing portions 123 of the base plate 12. Each mounting ear 224 defines a locating hole 2240. Three screws 2242 extend through the through holes 1230 of the fixing portions 123 of the base plate 12 and engage in the locating holes 2240 of the mounting ears 224, to fasten the fan frame 22 on the top face of the base plate 12. Thereby, the fan frame 22 and the base plate 12 together form a space for receiving the impeller 24 therein.

The clip 30 is formed by bending a resilient metal wire, and includes a middle portion 32 and two locking arms 34 extending from two ends of the middle portion 32. The projection of the middle portion 32 on the printed circuit board 40 goes across the center of the electronic device 42. The middle portion 32 is received in the narrow slot 1240 of the protrusion 124, and includes a confining portion 322 and two pressing portions 324 extending downwardly and then outwardly and horizontally from two ends of the confining portion 322. The confining portion 322 and the two pressing portions 324 are located in the same vertical plane. The confining portion 322 is received in the middle of the narrow slot 1240, and the pressing portions 324 are received in the two ends of the narrow slot 1240. Since the middle of the narrow slot 1240 is shallower than the two ends thereof, the clip 30 can be prevented from rotating around the middle portion 32. Each of the locking arms 34 extends slantwise upwardly and then slantwise downwardly from a respective one of two ends of the middle portion 32. The locking arms 34 are respectively located at two sides of the vertical plane where the middle portion 32 is located. Each locking arm 34 forms a locking hook 342 at a distal end thereof, for engaging with the locking loops 46 of the printed circuit board 40. Thereby, the heat sink 10 is fastened on the printed circuit board 40.

In use of the heat dissipation device, the heat dissipation device is placed on the printed circuit board 40. The lower pole sections 1274 of the protruding poles 127 of the base plate 12 extend through the two through holes 44 of the printed circuit board 40 until the upper pole sections 1272 of the protruding poles 127 abut the top face of the printed circuit board 40. At this stage, the heat conducting plate 14 of the heat sink 10 is brought into contact with the electronic device 42. Then, the locking hooks 342 of the clip 30 are caused to lock on the locking loops 46 on the printed circuit board 40, thereby firmly securing the heat sink 10 on the electronic device 42.

According to the above-described configuration, the base plate 12 of the heat sink 10 of the heat dissipation device is asymmetric about the clip 30. However, the connection line of the two protruding poles 127 goes across and is symmetrical about the center of the electronic device 42, and the connecting line of the protruding poles 127 intersects with the clip 30. Before the heat dissipation device is secured on the electronic device 42 by the clip 30, the two protruding poles 127 of the heat dissipation device extend through the printed circuit board 40. Thereby, the heat dissipation device can be located on the printed circuit board 40 in advance, and one end of the heat dissipation device can be prevented from tilting or rotating relative to the clip 30.

During operation of the heat dissipation device, the heat conducting plate 14 absorbs heat from the electronic device 42, and then conducts the heat to the heat pipe 18 and the fin assembly 16. The fan 20 draws air through the first air inlets 120 of the base plate 12 and the second air inlet 2200 of the fan 20 into the space formed by the fan frame 22 and the base plate 12. The air under the action of the impeller 24 is blown through and out of the fin assembly 16. Furthermore, because the first air inlets 120 are defined in the base plate 12, the air can be drawn through the bottom of the base plate 12, and the electronic device 42 below the base plate 12 can be cooled during the process of the air flowing into the first air inlets 120.

It is believed that the embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A heat dissipation device adapted for cooling an electronic device mounted on a printed circuit board, the heat dissipation device comprising:
   a base plate adapted for being thermally attached to the electronic device and comprising two protruding poles protruding downwardly from a bottom face thereof, the protruding poles being adapted for extending through the printed circuit board and thereby establishing a location for the heat dissipation device on the printed circuit board;

a clip attached on a top face of the base plate and adapted for fastening the heat dissipation device on the printed circuit board after the location for the heat dissipation device on the printed circuit board has been established; and a flat heat pipe, wherein a groove is defined in the top face of the base plate, and the heat pipe is received in the groove of the base plate and thermally contacts the base plate for absorbing heat from the electronic device;

wherein a fan is mounted on the base plate, a plurality of first air inlets are defined in the base plate below the fan, and the fan is for drawing ambient air to flow through the first air inlets of the base plate such that the electronic device below the base plate is cooled during the process of generation of the air flow.

2. The heat dissipation device of claim 1, wherein each of the protruding poles comprises an upper pole section extending downwardly from the bottom face of the base plate and a lower pole section extending downwardly from the upper pole section, the upper pole section has a diameter larger than that of the lower pole section, a bottom of the upper pole section presses a top face of the printed circuit board, and the lower pole section extends through the printed circuit board.

3. The heat dissipation device of claim 2, wherein the upper pole section has a height substantially equal to the height of the electronic device.

4. The heat dissipation device of claim 2, wherein the clip is in the form of a resilient metal wire and comprises a middle portion and two locking arms extending from two ends of the middle portion, the middle portion is capable of spanning across the center of the electronic device, and each of the two locking arms forms a locking hook at a distal end thereof for fastening the clip on the printed circuit board.

5. The heat dissipation device of claim 4, wherein an imaginary line connecting the two protruding poles intersects with the clip.

6. The heat dissipation device of claim 4, wherein the base plate has an elongate protrusion extending upwardly from the top surface thereof at a position corresponding to the electronic device below the base plate, the protrusion defines a slot along its extension direction, and the middle portion of the clip is received and fastened in the slot.

7. The heat dissipation device of claim 6, wherein a middle of the slot is shallower than each of two opposite ends of the slot, the middle portion of the clip comprises a confining portion and two pressing portions extending downwardly and then outwardly and horizontally from two ends of the confining portion, the confining portion is received in the middle of the slot, and the pressing portions are received in the two opposite ends of the slot.

8. The heat dissipation device of claim 6, wherein the base plate comprises a first part and a second part adjoining each other, the protrusion is formed on the second part of the base plate, and the base plate is asymmetric relative to the protrusion.

9. An electronic device assembly comprising:
a printed circuit board;
an electronic device mounted on the printed circuit board; and
a heat dissipation device for cooling the electronic device, the heat dissipation device comprising:

a base plate thermally attached to the electronic device and comprising two protruding poles protruding downwardly from a bottom face thereof, the protruding poles extending through the printed circuit board and thereby establishing a location for the heat dissipation device on the printed circuit board; and a clip attached on a top face of the base plate and fastening the heat dissipation device on the printed circuit board according to the established location for the heat dissipation device on the printed circuit board;

wherein a fan is mounted on the base plate, a plurality of first air inlets are defined in the base plate below the fan, and the fan is for drawing ambient air to flow through the first air inlets of the base plate such that the electronic device below the base plate is cooled during the process of generation of the air flow.

10. The electronic device assembly of claim 9, wherein each of the protruding poles comprises an upper pole section extending from the bottom face of the base plate and a lower pole section extending downwardly from the upper pole section, the upper pole section has a diameter larger than that of the lower pole section, a bottom of the upper pole section presses a top face of the printed circuit board, and the lower pole section extends through the printed circuit board.

11. The electronic device assembly of claim 10, wherein the upper pole section has a height substantially equal to the height of the electronic device.

12. The electronic device assembly of claim 10, wherein the clip is in the form of a resilient metal wire and comprises a middle portion and two locking arms connecting two ends of the middle portion, and the middle portion spans across the center of the electronic device, and each of the two locking arms forms a locking hook at a distal end thereof for fastening the clip on the printed circuit board.

13. The electronic device assembly of claim 12, wherein an imaginary line connecting the two protruding poles intersects with the clip.

14. The electronic device assembly of claim 12, wherein the base plate has an elongate protrusion extending upwardly from the top surface thereof at a position corresponding to the electronic device below the base plate, the protrusion defines a slot along its extension direction, and the middle portion of the clip is received and fastened in the slot.

15. The electronic device assembly of claim 14, wherein a middle of the slot is shallower than each of two opposite ends of the slot, and the middle portion of the clip comprises a confining portion and two pressing portions extending downwardly and then outwardly and horizontally from two ends of the confining portion, and the confining portion is received in the middle of the slot, and the pressing portions are received in the two opposite ends of the slot.

16. The electronic device assembly of claim 14, wherein the base plate comprises a first part and a second part adjoining each other, the protrusion is formed on the second part of the base plate, and the base plate is asymmetric relative to the protrusion.

17. The electronic device assembly of claim 9, further comprising a flat heat pipe, wherein a groove is defined in the top face of the base plate, and the heat pipe is received in the groove of the base plate and thermally contacts the base plate for absorbing heat from the electronic device.

18. A heat dissipation device adapted for cooling an electronic device mounted on a printed circuit board, the heat dissipation device comprising:

a base plate adapted for being thermally attached to the electronic device and comprising two protruding poles protruding downwardly from a bottom face thereof, the protruding poles being adapted for extending through the printed circuit board and thereby establishing a location for the heat dissipation device on the printed circuit board; and a clip attached on a top face of the base plate and adapted for fastening the heat dissipation device on the printed circuit board after the location for the heat dissipation device on the printed circuit board has been established;

wherein each of the protruding poles comprises an upper pole section extending downwardly from the bottom face of the base plate and a lower pole section extending downwardly from the upper pole section, the upper pole section has a diameter larger than that of the lower pole section, a bottom of the upper pole section presses a top face of the printed circuit board, and the lower pole section extends through the printed circuit board;

wherein the clip is in the form of a resilient metal wire and comprises a middle portion and two locking arms extending from two ends of the middle portion, the middle portion is adapted for spanning across the center of the electronic device, and each of the two locking arms forms a locking hook at a distal end thereof for fastening the clip on the printed circuit board; and wherein the base plate has an elongate protrusion extending upwardly from the top surface thereof at a position corresponding to the electronic device below the base plate, the protrusion defines a slot along its extension direction, and the middle portion of the clip is received and fastened in the slot.

* * * * *